(12) United States Patent
Yoshida et al.

(10) Patent No.: US 10,340,347 B1
(45) Date of Patent: Jul. 2, 2019

(54) SEMICONDUCTOR DEVICE AND SEMICONDUCTOR MODULE

(71) Applicant: PANASONIC INTELLECTUAL PROPERTY MANAGEMENT CO., LTD., Osaka (JP)

(72) Inventors: Kazuma Yoshida, Kyoto (JP); Takeshi Imamura, Kyoto (JP); Toshikazu Imai, Hyogo (JP); Ryosuke Okawa, Nara (JP); Ryou Kato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/146,272

(22) Filed: Sep. 28, 2018

(30) Foreign Application Priority Data

Jan. 19, 2018 (JP) .................................. 2018-007735
Jul. 18, 2018 (JP) .................................. 2018-135347

(51) Int. Cl.
| | |
|---|---|
| *H01L 29/417* | (2006.01) |
| *H01L 23/00* | (2006.01) |
| *H01L 27/088* | (2006.01) |
| *H01L 29/423* | (2006.01) |
| *H01L 29/78* | (2006.01) |

(52) U.S. Cl.
CPC ...... *H01L 29/41775* (2013.01); *H01L 23/562* (2013.01); *H01L 27/088* (2013.01); *H01L 29/41741* (2013.01); *H01L 29/4236* (2013.01); *H01L 29/7827* (2013.01)

(58) Field of Classification Search
CPC ................. H01L 27/088; H01L 23/562; H01L 29/41741; H01L 29/7827; H01L 29/4236
See application file for complete search history.

(56) References Cited

U.S. PATENT DOCUMENTS

2011/0169103 A1* 7/2011 Darwish ............. H01L 29/7823
257/409
2015/0115359 A1* 4/2015 Tamagawa ............ H01L 27/088
257/334

FOREIGN PATENT DOCUMENTS

JP 2010-205761 A 9/2010

* cited by examiner

*Primary Examiner* — Mounir S Amer
(74) *Attorney, Agent, or Firm* — McDermott Will & Emery LLP

(57) ABSTRACT

A semiconductor device includes a first gate electrode, a plurality of first source electrodes, a second gate electrode, and a plurality of second source electrodes. The first gate electrode is arranged with no other electrode between the first gate electrode and a first short side of the semiconductor substrate. The plurality of first source electrodes include a plurality of approximately rectangular first source electrodes arranged in stripes extending parallel to the lengthwise direction of the semiconductor substrate. The second gate electrode is arranged with no other electrode between the second gate electrode and a second short side of the semiconductor substrate. The plurality of second source electrodes include a plurality of approximately rectangular second source electrodes arranged in stripes extending parallel to the lengthwise direction of the semiconductor substrate.

15 Claims, 17 Drawing Sheets

| SAMPLE NAME | ELECTRODE CONFIGURATION | ON RESISTANCE (mΩ) | (1) FLOATING SOLDER COUNT | (2) SOURCE ELECTRODE SOLDER PROTRUSION COUNT | (1)+(2) |
|---|---|---|---|---|---|
| SAMPLE 1 |  | 2.20 | 1 | 4 | 5 |
| SAMPLE 2 |  | 2.17 | 1 | 3 | 4 |
| SAMPLE 3 |  | 2.15 | 0 | 5 | 5 |
| COMPARATIVE SAMPLE |  | 2.17 | 81 | 7 | 88 |

SEMICONDUCTOR DEVICE AND SEMICONDUCTOR MODULE

CROSS REFERENCE TO RELATED APPLICATION

This application claims the benefit of priority of Japanese Patent Application Number 2018-007735 filed on Jan. 19, 2018, and Japanese Patent Application Number 2018-135347 filed on Jul. 18, 2018, the entire contents of which are hereby incorporated by reference.

BACKGROUND

1. Technical Field

The present disclosure relates to a semiconductor device and a semiconductor module, and in particular to a chip-size package (CSP) semiconductor device.

2. Description of the Related Art

A conventional semiconductor device is known that includes a semiconductor substrate with electrodes formed on the top surface and a metal layer formed in contact with the entire bottom surface of the semiconductor substrate (for example, see Japanese Unexamined Patent Application Publication No. 2010-205761).

SUMMARY

Typically, silicon and metal have different rates of thermal expansion. The semiconductor device therefore warps in the reflow process for mounting the semiconductor device to the mounting substrate, and the warping causes faults relating to the bonding material that bonds the semiconductor device and the mounting substrate occur.

In view of this, the present disclosure has an object to provide a semiconductor device and a semiconductor module capable of reducing the frequency at which faults relating to bonding material occur in the reflow process for mounting the semiconductor device to the mounting substrate.

A semiconductor device according to one aspect of the present disclosure is in a face-down, chip-size package, and includes: a semiconductor substrate that is rectangular and includes an impurity of a first conductivity type; a low-concentration impurity layer that is in contact with a top surface of the semiconductor substrate and includes an impurity of the first conductivity type in a lower concentration than a concentration of the impurity of the first conductivity type included in the semiconductor substrate; and a metal layer that is in contact with an entire bottom surface of the semiconductor substrate and includes only a metal material, the semiconductor device having a curvature at room temperature that curves in a lengthwise direction of the semiconductor substrate. The semiconductor device further includes: a first vertical metal oxide semiconductor (MOS) transistor in a first region of the low-concentration impurity layer; and a second vertical MOS transistor in a second region of the low-concentration impurity layer adjacent to the first region. The first vertical MOS transistor includes, on a surface of the low-concentration impurity layer, a first gate electrode and a plurality of first source electrodes. The second vertical MOS transistor includes, on the surface of the low-concentration impurity layer, a second gate electrode and a plurality of second source electrodes. The semiconductor substrate acts as a common drain region for a first drain region of the first vertical MOS transistor and a second drain region of the second vertical MOS transistor. A bidirectional channel from the plurality of first source electrodes to the plurality of second source electrodes via the first drain region, the metal layer, and the second drain region is a principal current channel. In a plan view of the semiconductor substrate, the first gate electrode is arranged with no other electrode disposed between the first gate electrode and a first short side of the semiconductor substrate. The plurality of first source electrodes include a plurality of first source electrodes that are approximately rectangular in a plan view of the semiconductor substrate. In a plan view of the semiconductor substrate, the plurality of first source electrodes that are approximately rectangular are arranged in stripes extending parallel to the lengthwise direction of the semiconductor substrate. In a plan view of the semiconductor substrate, the second gate electrode is arranged with no other electrode disposed between the second gate electrode and a second short side of the semiconductor substrate. The plurality of second source electrodes include a plurality of second source electrodes that are approximately rectangular in a plan view of the semiconductor substrate. In a plan view of the semiconductor substrate, the plurality of second source electrodes that are approximately rectangular are arranged in stripes extending parallel to the lengthwise direction of the semiconductor substrate. In a plan view of the semiconductor substrate, a boundary line between the first region and the second region is an approximate line segment. In a plan view of the semiconductor substrate, the first gate electrode and the second gate electrode are symmetrical to one another with respect to the boundary line, and the plurality of first source electrodes and the plurality of second source electrodes are symmetrical to one another with respect to the boundary line.

With the semiconductor device according to one aspect of the present disclosure, it is possible to reduce the frequency at which faults relating to bonding material occur in the reflow process for mounting the semiconductor device to the mounting substrate.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Figure 1:
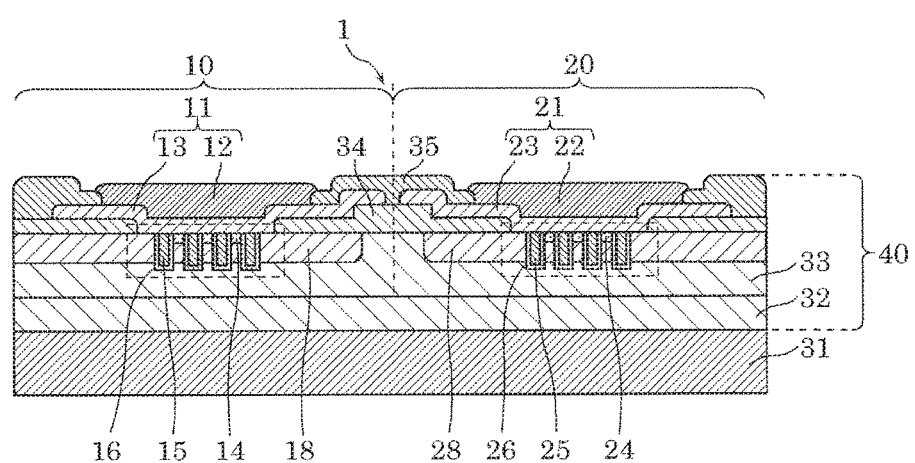
FIG. 1 is a cross-sectional view illustrating one example of the structure of a semiconductor device according to an embodiment.

A semiconductor device according to one aspect of the present disclosure is in a face-down, chip-size package, and includes: a semiconductor substrate that is rectangular and includes an impurity of a first conductivity type; a low-concentration impurity layer that is in contact with a top surface of the semiconductor substrate and includes an impurity of the first conductivity type in a lower concentration than a concentration of the impurity of the first conductivity type included in the semiconductor substrate; and a metal layer that is in contact with an entire bottom surface of the semiconductor substrate and includes only a metal material, the semiconductor device having a curvature at room temperature that curves in a lengthwise direction of the semiconductor substrate. The semiconductor device further includes: a first vertical metal oxide semiconductor (MOS) transistor in a first region of the low-concentration impurity layer; and a second vertical MOS transistor in a second region of the low-concentration impurity layer adjacent to the first region. The first vertical MOS transistor includes, on a surface of the low-concentration impurity layer, a first gate electrode and a plurality of first source electrodes. The second vertical MOS transistor includes, on the surface of the low-concentration impurity layer, a second gate electrode and a plurality of second source electrodes. The semiconductor substrate acts as a common drain region for a first drain region of the first vertical MOS transistor and a second drain region of the second vertical MOS transistor. A bidirectional channel from the plurality of first source electrodes to the plurality of second source electrodes via the first drain region, the metal layer, and the second drain region is a principal current channel. In a plan view of the semiconductor substrate, the first gate electrode is arranged with no other electrode disposed between the first gate electrode and a first short side of the semiconductor substrate. The plurality of first source electrodes include a plurality of first source electrodes that are approximately rectangular in a plan view of the semiconductor substrate. In a plan view of the semiconductor substrate, the plurality of first source electrodes that are approximately rectangular are arranged in stripes extending parallel to the lengthwise direction of the semiconductor substrate. In a plan view of the semiconductor substrate, the second gate electrode is arranged with no other electrode disposed between the second gate electrode and a second short side of the semiconductor substrate. The plurality of second source electrodes include a plurality of second source electrodes that are approximately rectangular in a plan view of the semiconductor substrate. In a plan view of the semiconductor substrate, the plurality of second source electrodes that are approximately rectangular are arranged in stripes extending parallel to the lengthwise direction of the semiconductor substrate. In a plan view of the semiconductor substrate, a boundary line between the first region and the second region is an approximate line segment. In a plan view of the semiconductor substrate, the first gate electrode and the second gate electrode are symmetrical to one another with respect to the boundary line, and the plurality of first source electrodes and the plurality of second source electrodes are symmetrical to one another with respect to the boundary line.

With this configuration, the frequency of faults resulting from warpage of the semiconductor device during the reflow process for mounting the semiconductor device to the mounting substrate, such as faults resulting from the bonding material used to bond the plurality of first source electrodes and the plurality of second source electrodes to the mounting substrate protruding out from the electrode(s) or open circuit faults regarding electrode-to-substrate electrode bonding at the first gate electrode and the second gate electrode, can be reduced.

Hereinafter, a semiconductor device according to one aspect of the present disclosure and a semiconductor module according to one aspect of the present disclosure including the semiconductor device mounted to a mounting substrate via reflow will be described with reference to the drawings.

The embodiment described below shows a specific example of the present disclosure. The numerical values, shapes, materials, elements, the arrangement and connection of the elements, etc., indicated in the following embodiment are mere examples, and therefore do not intend to limit the present disclosure. Therefore, among elements in the following embodiment, those not recited in any of the broadest, independent claims are described as optional elements.

Embodiment (1. Semiconductor Device Basic Structure)

Hereinafter, the structure of semiconductor device 1 according to the present disclosure will be described. Semiconductor device 1 according to the present disclosure is a chip-size package (CSP) multi-transistor chip including two vertical metal oxide semiconductor (MOS) transistors formed on semiconductor substrate 32. These two vertical MOS transistors are power transistors, and are what are known as trench MOS field-effect transistors (MOSFETs).

Figure 2A:
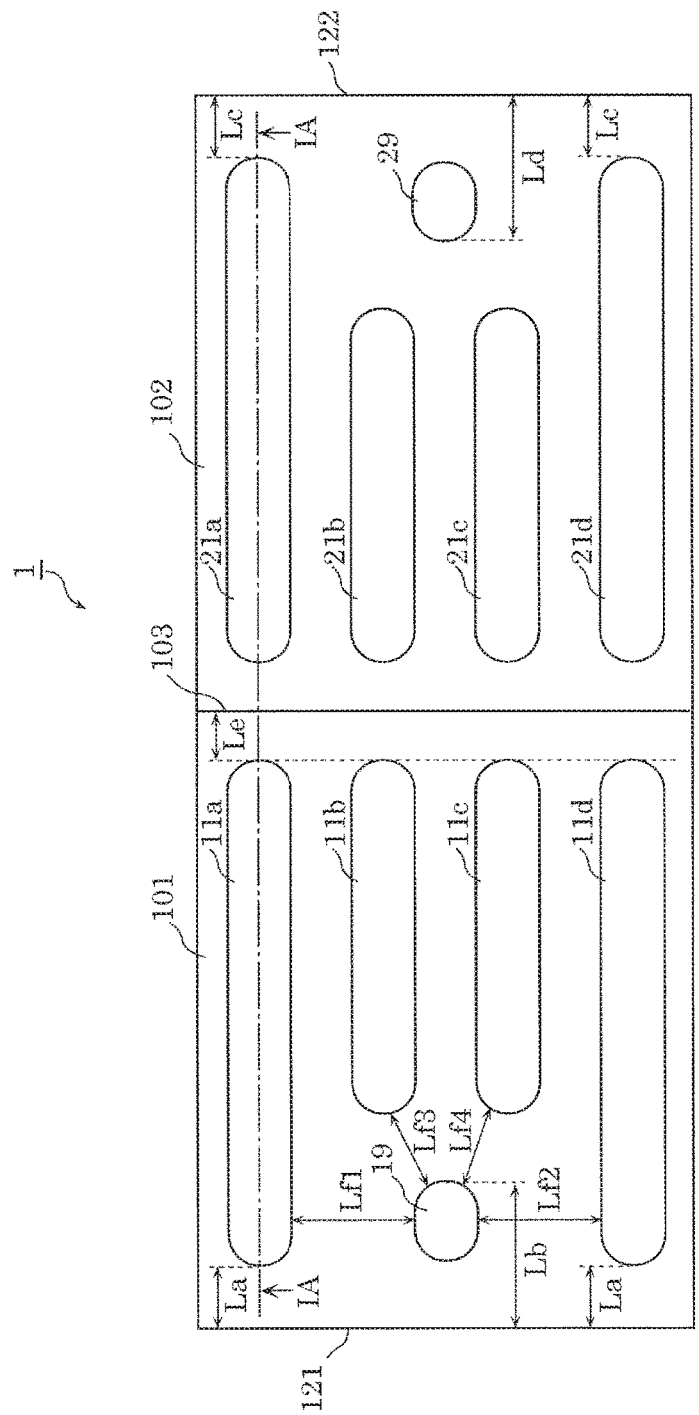
FIG. 2A is a top view illustrating one example of an electrode configuration of a semiconductor device according to an embodiment.
Figure 2B:
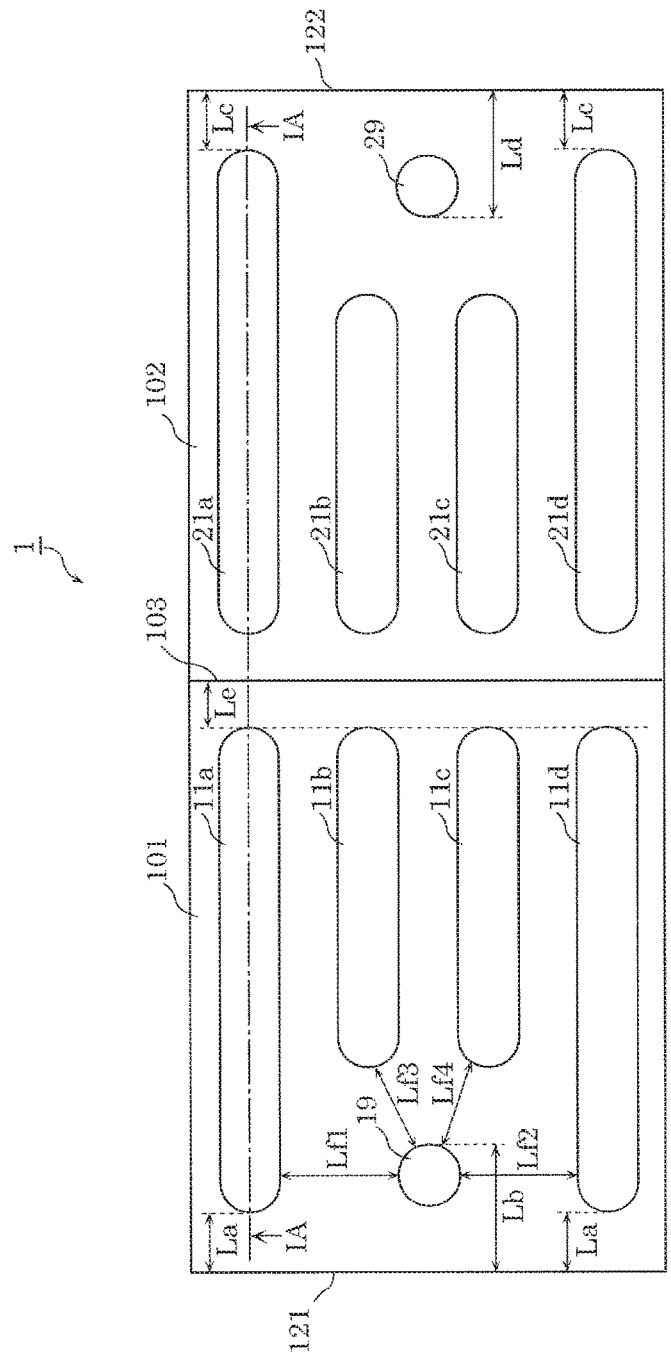
FIG. 2B is a top view illustrating one example of an electrode configuration of a semiconductor device according to an embodiment.

FIG. 1 is a cross-sectional view illustrating one example of the structure of semiconductor device 1. FIG. 2A and FIG. 2B are top views illustrating respective electrode configuration examples of semiconductor device 1. The cross-sectional view in FIG. 1 is taken along line IA-IA in FIG. 2A or FIG. 2B.

As illustrated in FIG. 1, semiconductor device 1 includes semiconductor substrate 32, low-concentration impurity layer 33, metal layer 31, first vertical MOS transistor 10 (hereinafter referred to simply as "transistor 10"), and second vertical MOS transistor 20 (hereinafter referred to simply as "transistor 20").

As illustrated in either of FIG. 2A or FIG. 2B, in a plan view of the rectangular semiconductor substrate 32, semiconductor device 1 includes first region 101 in which transistor 10 is formed and second region 102 in which transistor 20 is formed. The positions of first region 101 and second region 102 are symmetrical to one another with respect to transverse boundary line 103 located in the lengthwise center of semiconductor substrate 32.

Transistor 10 includes, on the surface of low-concentration impurity layer 33 in first region 101, first gate electrode 19 and a plurality of first source electrodes 11 (first source electrodes 11a through 11d).

In a plan view of semiconductor substrate 32, first gate electrode 19 is formed with no other electrode disposed between it and first short side 121 of 6 semiconductor substrate 32.

In a plan view of semiconductor substrate 32, the plurality of first source electrodes 11 include a plurality of approximately rectangular source electrodes. The plurality of approximately rectangular first source electrodes 11 are formed in stripes extending parallel to the lengthwise direction of semiconductor substrate 32. Here, "approximately rectangular" includes shapes whose longitudinal ends are circular arcs, as illustrated in FIG. 2A and FIG. 2B, or truncated polygons (not illustrated in the drawings).

Transistor 20 includes, on the surface of low-concentration impurity layer 33 in second region 102, second gate electrode 29 and a plurality of second source electrodes 21 (second source electrodes 21a through 21d).

In a plan view of semiconductor substrate 32, second gate electrode 29 is formed with no other electrode disposed between it and second short side 122 of semiconductor substrate 32.

In a plan view of semiconductor substrate 32, the plurality of second source electrodes 21 include a plurality of approximately rectangular source electrodes. The plurality of approximately rectangular second source electrodes 21 are formed in stripes extending parallel to the lengthwise direction of semiconductor substrate 32. Here, "approximately rectangular" includes shapes whose longitudinal ends are circular arcs, as illustrated in FIG. 2A and FIG. 2B, or truncated polygons.

Here, in a plan view of semiconductor substrate 32, first gate electrode 19 and second gate electrode 29 are symmetrical to one another with respect to boundary line 103, and the plurality of first source electrodes 11 and the plurality of second source electrodes 21 are symmetrical to one another with respect to boundary line 103. Hereinafter, description regarding components on one side of boundary line 103 functioning as the line of symmetry also apply to components on the other side.

Note that semiconductor device 1 may include one or more first gate electrodes 19 and one or more second gate electrodes 29; the number of first gate electrodes 19 and second gate electrodes 29 is not limited to the example illustrated in FIG. 2A and FIG. 2B of one each.

Note that semiconductor device 1 may include two or more first source electrodes 11 and two or more second source electrodes 21; the number of first source electrodes 11 and second source electrodes 21 is not limited to the example illustrated in FIG. 2A and FIG. 2B of four each.

Note that semiconductor device 1 may include two or more first source electrodes 11 that are approximately rectangular in shape and two or more second source electrodes 21 that are approximately rectangular in shape; the number of such first source electrodes 11 and second source electrodes 21 is not limited to the example illustrated in FIG. 2A and FIG. 2B of four each.

Note that first gate electrode 19 and second gate electrode 29 may be shaped such that the span in a direction parallel to the lengthwise direction of semiconductor substrate 32 is greater than the span in a direction parallel to the transverse direction of semiconductor substrate 32, as illustrated in FIG. 2A. Alternatively, first gate electrode 19 and second gate electrode 29 may be shaped as circles, as illustrated in FIG. 2B.

Semiconductor substrate 32 includes a first conductivity type impurity and silicon. For example, semiconductor substrate 32 is an N-type silicon substrate.

Low-concentration impurity layer 33 is formed so as to be in contact with the top surface of semiconductor substrate 32 (the upper major surface in FIG. 1), and includes a first conductivity type impurity in a lower concentration than the concentration of the first conductivity type impurity included in semiconductor substrate 32. For example, low-concentration impurity layer 33 may be formed on semiconductor substrate 32 via epitaxial growth.

Metal layer 31 is formed so as to be in contact with the entire bottom surface (the lower major surface in FIG. 1) of semiconductor substrate 32, and includes only a metal material. In one non-limiting example, metal layer 31 may be made of a metal material including one or more of silver, copper, gold, and aluminum. However, note that metal layer 31 may include a fine amount of an element other than a metal introduced as an impurity while manufacturing the metal material.

Transistor 10 is formed in first region 101 of low-concentration impurity layer 33 (the left half of low-concentration impurity layer 33 in FIG. 1), and includes a plurality of first source electrodes 11 and first gate electrode 19 (see FIG. 2A or FIG. 2B) formed on the top surface of low-concentration impurity layer 33.

First body region 18 including a second conductivity type-which is different from the first conductivity type-impurity is formed in first region 101 of low-concentration impurity layer 33. First source region 14 including a first conductivity type impurity, first gate conductor 15, and first gate insulating film 16 are formed in first body region 18. Each first source electrode 11 includes first section 12 and second section 13. First section 12 is connected to first source region 14 and first body region 18 via second section 13. First gate electrode 19 is connected to first gate conductor 15.

First section 12 of each first source electrode 11 is a layer exhibiting good bonding properties with a bonding material such as solder during reflow. In one non-limiting example, first section 12 may be made of a metal material including one or more of nickel, titanium, tungsten, and palladium. The surface of first section 12 may be plated with, for example, gold.

Second section 13 of each first source electrode 11 is a layer that connects first section 12 with first source region 14 and first body region 18. In one non-limiting example, second section 13 may be made of a metal material including one or more of aluminum, copper, gold, and silver.

Transistor 20 is formed in second region 102 of low-concentration impurity layer 33, which is the region adjacent to first region 101 in a direction along the top surface of semiconductor substrate 32 (the right half of low-concentration impurity layer 33 in FIG. 1). and includes a plurality of second source electrodes 21 and second gate electrode 29 (see FIG. 2A or FIG. 2B) formed on the top surface of low-concentration impurity layer 33.

Second body region 28 including a second conductivity type-which is different from the first conductivity type-impurity is formed in second region 102 of low-concentration impurity layer 33. Second source region 24 including a first conductivity type impurity, second gate conductor 25, and second gate insulating film 26 are formed in second body region 28. Each second source electrode 21 includes first section 22 and second section 23. First section 22 is connected to second source region 24 and second body region 28 via second section 23. Second gate electrode 29 is connected to second gate conductor 25.

First section 22 of each second source electrode 21 is a layer exhibiting good bonding properties with a bonding material such as solder during reflow. In one non-limiting example, first section 22 may be made of a metal material including one or more of nickel, titanium, tungsten, and palladium. The surface of first section 22 may be plated with, for example, gold.

Second section 23 of each second source electrode 21 is a layer that connects first section 22 with second source region 24 and second body region 28. In one non-limiting example, second section 23 may be made of a metal material including one or more of aluminum, copper, gold, and silver.

With the configurations of transistors 10 and 20 described above, semiconductor substrate 32 acts as a common drain region shared by the first drain region of transistor 10 and the second drain region of transistor 20.

First body region 18 and second body region 28 are covered by interlayer insulating film 34 having an opening. Moreover, second regions 13 and 23 of the source electrodes are connected to first source region 14 and second source region 24 through the opening in interlayer insulating film 34. Interlayer insulating film 34 and second sections 13 and 23 of the source electrodes are covered by passivation layer 35 having an opening. Moreover, first sections 12 and 22 of the source electrodes are connected to second sections 13 and 23, respectively, through the opening in passivation layer 35.

Here, the layered structure of semiconductor substrate 32, low-concentration impurity layer 33, interlayer insulating film 34, and passivation layer 35 is defined as semiconductor layer 40. Regarding the structural dimensions for these structures, in one example, semiconductor substrate 32 and low-concentration impurity layer 33 have a sum total thickness of 62 μm, metal layer 31 has a thickness of 30 μm, and interlayer insulating film 34 and passivation layer 35 have a sum total thickness of 8 μm. Under these conditions, semiconductor layer 40 has a thickness of 70 μm.

Application Example

Figure 3:
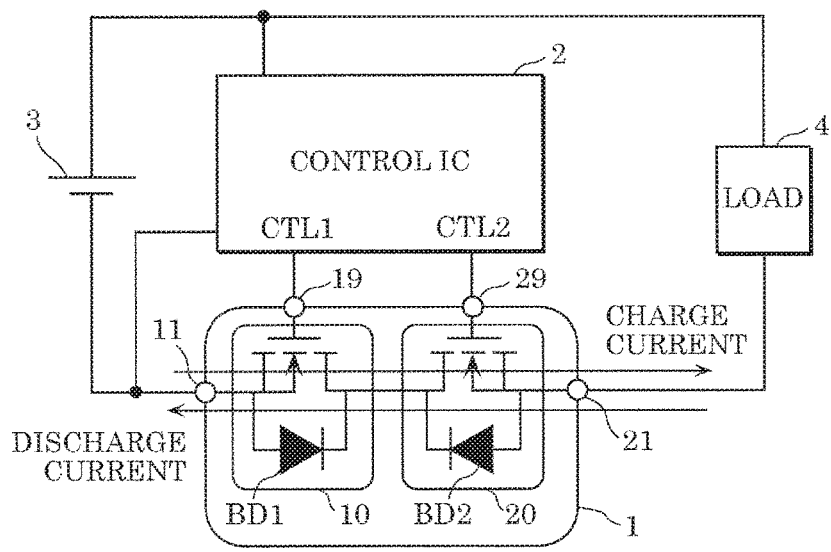
FIG. 3 is a circuit diagram illustrating an example in which a semiconductor device according to an embodiment is applied to a charge-discharge circuit.

FIG. 3 illustrates a charge-discharge circuit for, for example, a smartphone, as an application example. In this application example, semiconductor device 1 is inserted on the low side of this charge-discharge circuit, and functions as a charge-discharge switch that controls the conductivity of current flowing in both directions.

Here, semiconductor device 1 functions as a bidirectional transistor that controls discharge current from battery 3 to load 4 and charge current from load 4 to battery 3, in accordance with a control signal applied from control IC 2. The discharge current is interrupted by switching transistor 10 off and the charge current is interrupted by switching transistor 20 off.

Since, due to device configuration, a body diode is provided as parasitic element between the drain and source terminals in a MOS transistor (for example, BD1 in transistor 10 and BD2 in transistor 20 in FIG. 3), with a single MOS transistor, current flowing in both directions between the drain and source terminals cannot be interrupted. Thus, in order to interrupt current flowing in both directions, typically two MOS transistors are connected with their drain or source terminals facing each other.

When semiconductor device 1 is used as a bidirectional switch in this charge-discharge circuit, there is a demand to have a low on resistance between the source electrodes of semiconductor device 1 (i.e., between the plurality of first source electrodes 11 and the plurality of second source electrodes 21). However, the resistance to conduction via the common drain in semiconductor device 1 is high, and with the low on resistance due to the addition of the approximately 20 μm thick metal layer 31, consumer requests cannot be met, necessitating a metal layer 31 that is at least 30 μm thick.

Accordingly, in semiconductor device 1 according to the present disclosure, the thickness of metal layer 31 is set such that the bidirectional channel between the plurality of first source electrodes 11 and the plurality of second source electrodes 21 along which current flows via the first drain region, metal layer 31, and the second drain region functions as the principal current channel. Here, the principal current channel is the channel along which current flows the most among current flowing between electrodes (i.e., between the plurality of first source electrodes 11 and the plurality of second source electrodes 21) in semiconductor device 1 (hereinafter, this current is referred to as "principal current"). Since the resistance to conduction of metal layer 31 is very small relative to the resistance to conduction of the common drain region, the principal current channel can be metal layer 31, and the value of the resistance to conduction of metal layer 31 and the on resistance value of semiconductor device 1 can be made to be dominant by adjusting the thickness of metal layer 31.

Implementation Example

Figure 4:
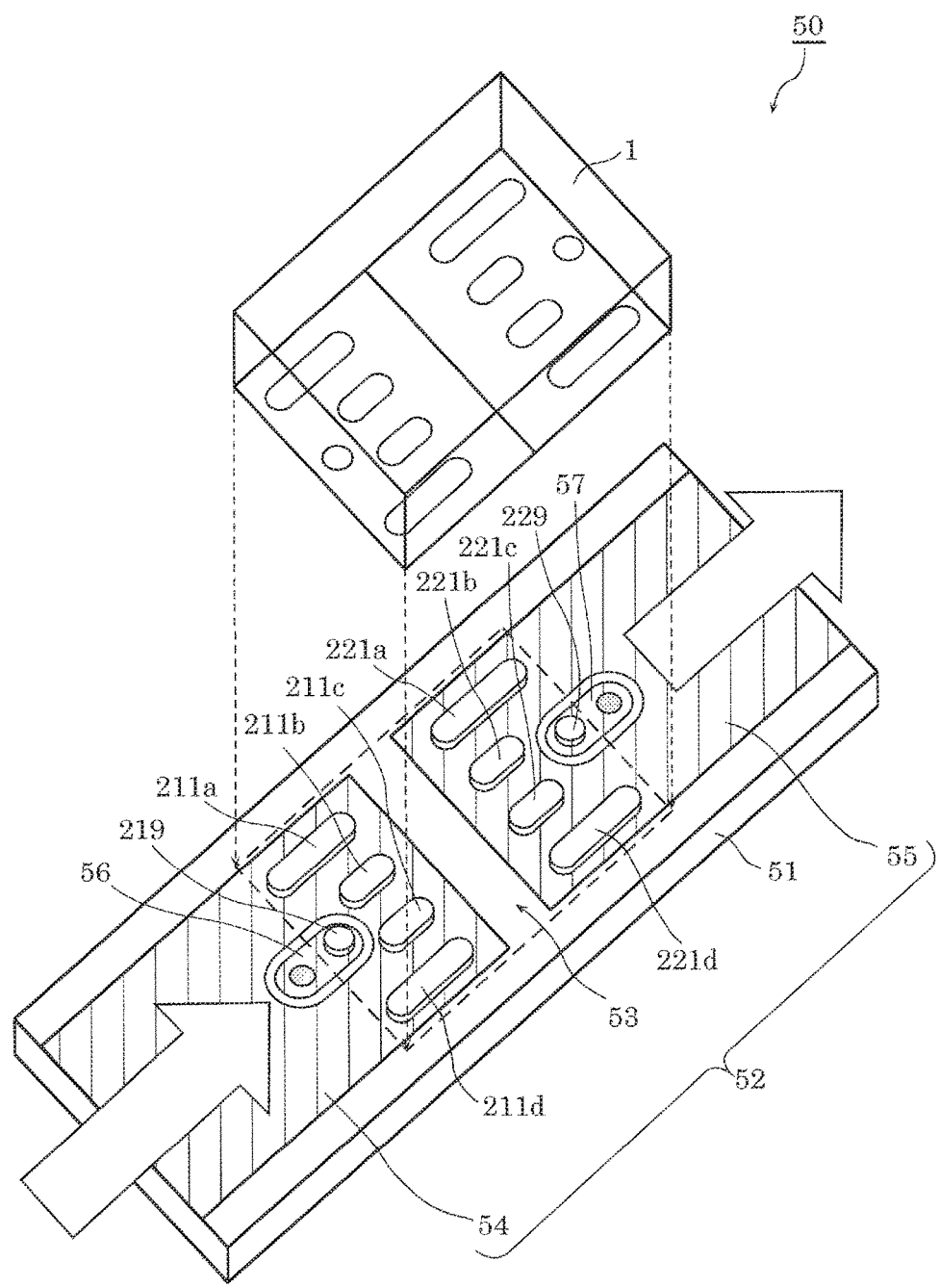
FIG. 4 is an exploded perspective view illustrating one example of the structure of an implementation of a semiconductor device according to an embodiment.

FIG. 4 is an exploded perspective view illustrating one example of the structure of an implementation example in which semiconductor device 1 according to this embodiment is implemented in semiconductor module 50.

Semiconductor module 50 includes mounting substrate 51, wiring patterns 52, 56, 57, bonding material, and semiconductor device 1.

Wiring pattern 52 is provided in a band-shaped region on the top surface of mounting substrate 51, and is divided into a first section 54 and a second section 55 by gap 53 intersecting the lengthwise direction. Semiconductor device 1 is mounted above gap 53.

Mounting substrate 51 further includes a plurality of substrate electrodes bonded in positions respectively corresponding to the plurality of electrodes in semiconductor device 1, via a bonding material when mounting semiconductor device 1 face-down.

More specifically, the plurality of substrate electrodes include first gate substrate electrode 219, a plurality of first source substrate electrodes 211 (first source substrate electrodes 211a through 211d), second gate substrate electrode 229, and a plurality of second source substrate electrodes 221 (second source substrate electrodes 221a through 221d). FIG. 4 illustrates a state in which bonding material is arranged at discrete locations corresponding to the substrate electrodes on wiring patterns 52, 56, and 57.

Semiconductor device 1 is mounted on mounting substrate 51 by arranging bonding material at locations corresponding to the substrate electrodes on mounting substrate 51, arranging semiconductor device 1 face down such that the electrodes on semiconductor device 1 are aligned with the corresponding substrate electrode locations on mounting substrate 51, and performing reflow while applying constant pressure to semiconductor device 1 (e.g., applying pressure so as to achieve a 80 μm gap between mounting substrate 51 and semiconductor device 1).

(2. Warping of Semiconductor Device and Problems Arising Therefrom)

In the reflow process performed while semiconductor device 1 is arranged face down on mounting substrate 51, the plurality of first source electrodes 11, first gate electrode 19, the plurality of second source electrodes 21, and second gate electrode 29 are bonded with the substrate electrodes provided on mounting substrate 51 via a bonding material such as solder.

Semiconductor device 1 is a layered structure including semiconductor layer 40 whose main component is silicon and metal layer 31 including a metal material. Since the rate of thermal expansion of metal is greater than that of silicon, depending on the temperature of the environment, the layered structure may warp.

Figure 5A:
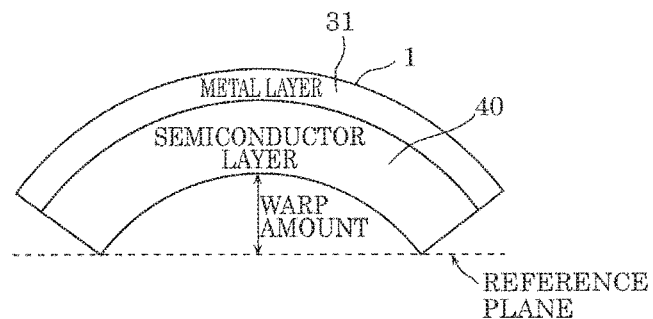
FIG. 5A is a schematic illustration of a cross section taken along the lengthwise direction of a semiconductor device according to an embodiment that is warped such that the semiconductor side is concave.
Figure 5B:
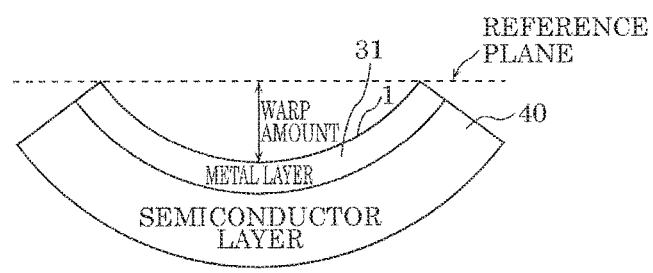
FIG. 5B is a schematic illustration of a cross section taken along the lengthwise direction of a semiconductor device according to an embodiment that is warped such that the metal layer side is concave.

FIG. 5A is a schematic illustration of a cross section taken along the lengthwise direction of semiconductor device 1 when the layered structure warps such that the semiconductor layer 40 side is concave. FIG. 5B is a schematic illustration of a cross section taken along the lengthwise direction of semiconductor device 1 when the layered structure warps such that the metal layer 31 side is concave.

Hereinafter, warping that results in the semiconductor layer 40 side being concave, like in FIG. 5A, is referred to as "positive warping", and warping that results in the metal layer 31 side being concave, like in FIG. 5B, is referred to as "negative warping".

Additionally, when semiconductor device 1 warps, the difference in height between the lengthwise central region and the distal ends is referred to as "warp amount", as illustrated in FIG. 5A and FIG. 5B.

Figure 5C:
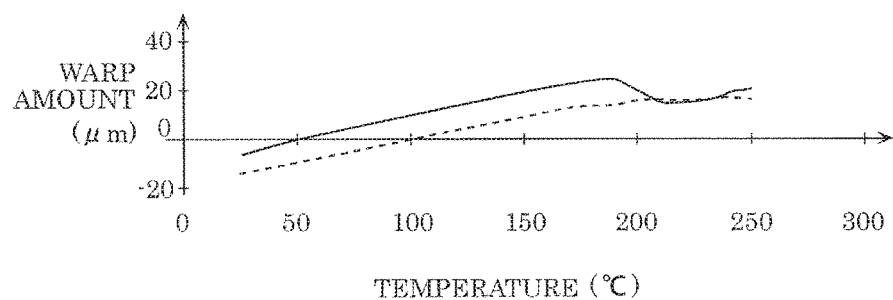
FIG. 5C is a graph illustrating warp amount when a semiconductor device according to an embodiment is heated.

FIG. 5C is a graph illustrating warp amount when semiconductor device 1 is heated. Here, semiconductor device 1 is 3.40 mm long and 1.96 mm wide, and includes a 70 μm thick semiconductor layer 40 and a 30 μm thick metal layer 31.

The data indicated by the solid line is data for when heat is initially applied after additionally forming metal layer 31 on semiconductor layer 40 by, for example, plating. This data shows that semiconductor device 1 begins warping in the opposite direction at around 50 degrees Celsius. This is thought to be due the temperature at the time of plating being around 50 degrees Celsius, and thus metal layer 31 contracts when under 50 degrees Celsius and expands when over 50 degrees Celsius. At around 180 degrees Celsius, the warp amount temporarily decreases. This is thought to be due to the metal included in metal layer 31, which is formed by plating, re-crystallizing when metal layer 31 is heated to around 180 degrees Celsius, and the physical constant relative to heat changing.

The data indicated by the broken line is data for when semiconductor device 1 is reheated after having been heated to 250 degrees Celsius in the initial heating and then cooled to room temperature. Unlike the graph of the data for when heat is initially applied, there are no undulations. Since this is after the physical constant relative to heat of the metal included in metal layer 31 has changed in the initial heating, this is thought to be due to behavior based on properties of metal layer 31 after the change.

Based on the above data, it is known that semiconductor device 1 exhibits negative warping at room temperatures no more than 50 degrees Celsius, and exhibits positive warping at high temperatures no less than 100 degrees Celsius (for example, at a melting temperature of the bonding material such as solder during reflow, which is from 180 to 200 degrees Celsius), to a relatively high warp amount of 20 to 30 μm.

Figure 6:
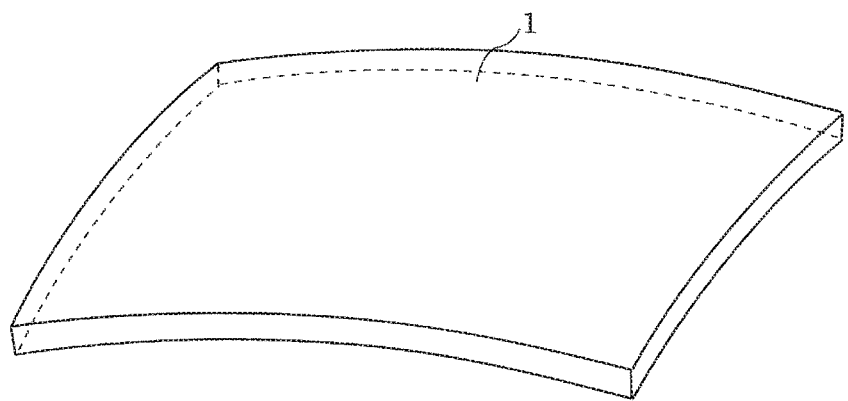
FIG. 6 is a perspective view schematically illustrating a semiconductor device according to an embodiment that is warped in a typical manner.

Hereinbefore, the warping of semiconductor device 1 is only considered in one dimension, but should actually be considered in two dimensions. Accordingly, FIG. 6 illustrates a schematic perspective view of semiconductor device 1 in a typical warped state. Semiconductor device 1 typically warps such that the same side is concave both lengthwise and transversely (exemplified as the bottom surface side being concave in FIG. 6), and the warp amount in the lengthwise direction is typically greater than the warp amount in the transverse direction. This coincides with the knowledge that the warp amount of a rectangular cuboid is proportional to the square of the length in the direction of the warpage.

Figure 7:
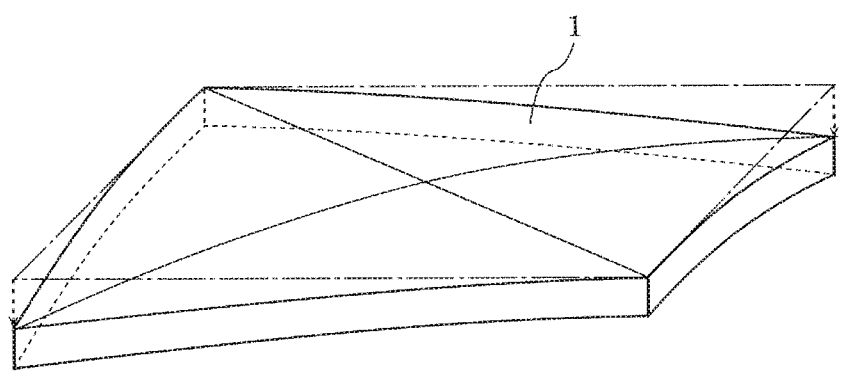
FIG. 7 is a perspective view schematically illustrating a semiconductor device according to an embodiment that is warped diagonally from corner to corner.

FIG. 7 illustrates a schematic perspective view of semiconductor device 1 when warped along diagonal lines connecting the corners in a plan view of semiconductor device 1. This may occur if, when additionally forming metal layer 31 on semiconductor layer 40 via, for example, plating, metal layer 31 is not evenly formed on the entire surface of semiconductor layer 40.

Moreover, the warp amount of semiconductor device 1 varies depending on the ratio between the thickness of semiconductor layer 40 and the thickness of metal layer 31. When the thickness of semiconductor layer 40 is 70 μm and the thickness of metal layer 31 is no more than 70 μm, the warp amount increases as the thickness of metal layer 31 increases. In other words, when setting the thickness of metal layer 31, there is a tradeoff between the on resistance value of semiconductor device 1 and the warp amount in reflow of semiconductor device 1.

Therefore, when developing an actual product using semiconductor device 1, more often than not, reducing the on resistance value takes priority, and the absolute value of the warp amount is set to a value permissible under some set of standards such as JEITA (for example, roughly 40 μm or less). Thus, if semiconductor device 1 warps approximately 40 μm, measures need to be taken so that problems relating to warpage of that extent do not arise, but practically speaking (1) an open circuit fault resulting from an insufficient bond between semiconductor device 1 and mounting substrate 51, or (2) a short circuit fault resulting from the bonding material protruding out from an electrode or floating solder separated from an electrode may occur.

(3. Positioning and Shapes of Electrodes in the Semiconductor Device)

The inventors produced multiple types of samples of semiconductor device 1 having a lengthwise dimension of 3.40 mm, a transverse dimension of 1.96 mm, a semiconductor layer 40 thickness of 70 μm, and a metal layer 31 thickness of 30 μm, by varying the arrangement and shapes of the electrodes in semiconductor device 1 (first source electrodes 11, second source electrodes 21, first gate electrode 19, and second gate electrode 29 in FIG. 2A, FIG. 2B).

Figure 8A:
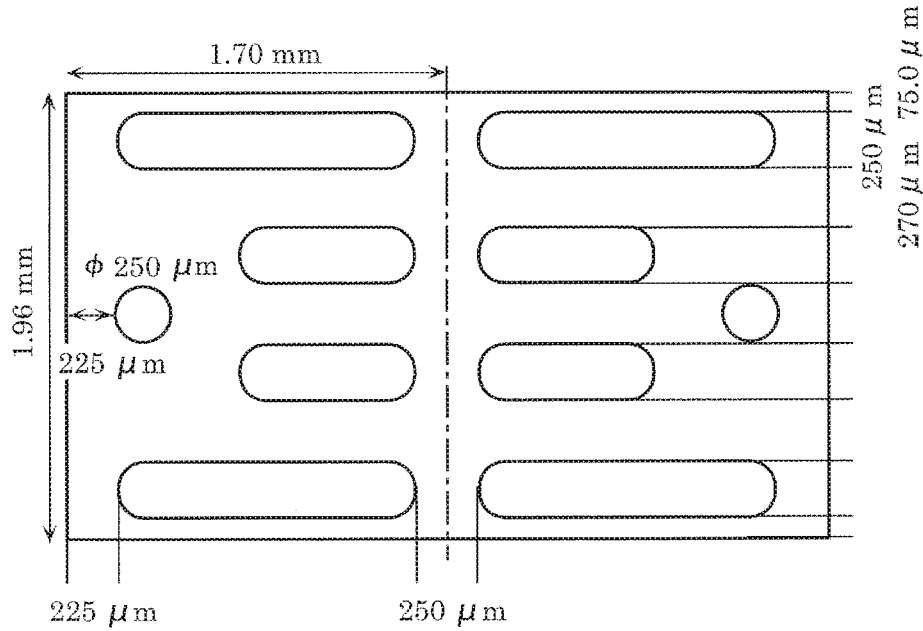
FIG. 8A is a top view of an electrode configuration of sample 1.
Figure 8B:
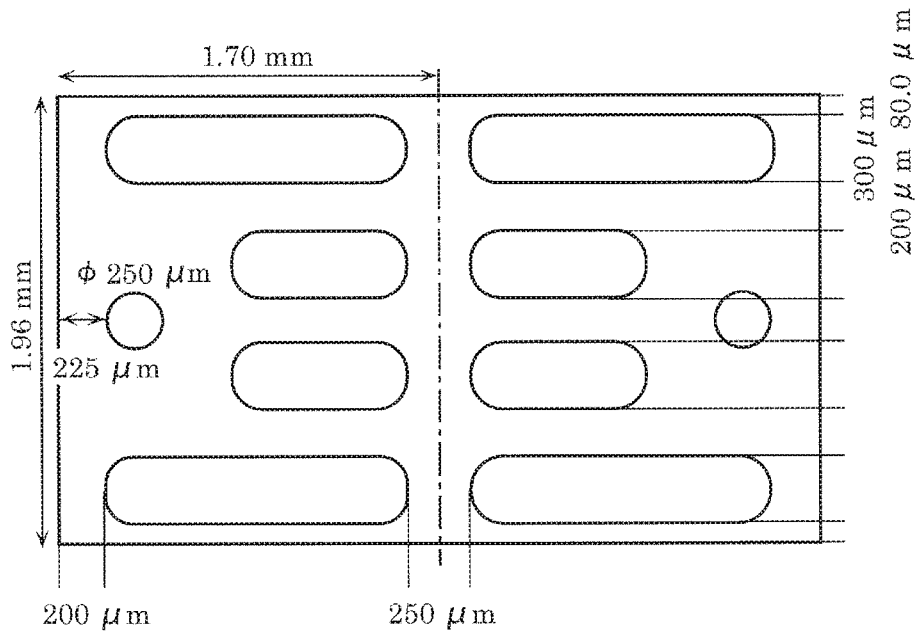
FIG. 8B is a top view of an electrode configuration of sample 2.
Figure 8C:
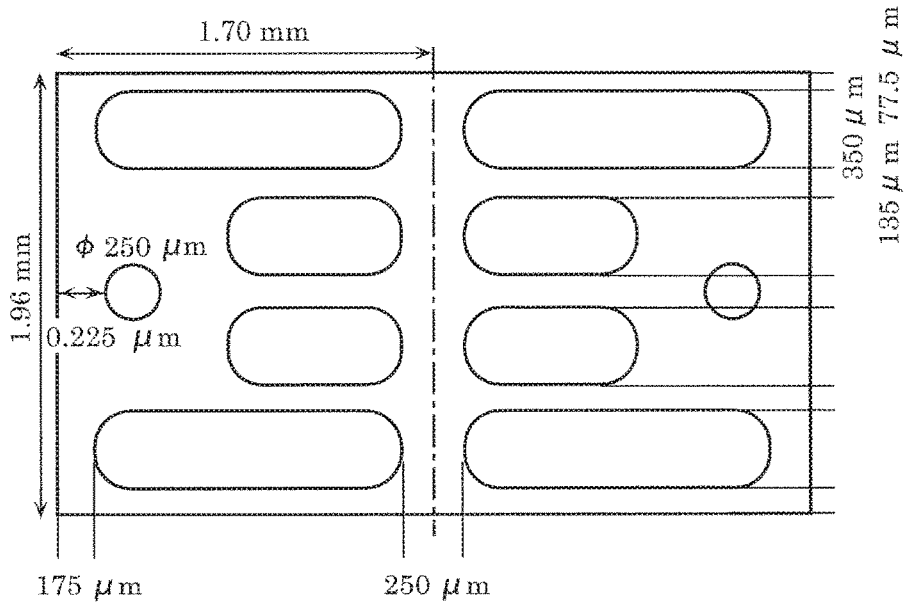
FIG. 8C is a top view of an electrode configuration of sample 3.

FIG. 8A, FIG. 8B, and FIG. 8C are top views of electrode configurations of representative samples produced by the inventors. Hereinafter, the electrode configuration sample illustrated in FIG. 8A is referred to as sample 1, the electrode configuration sample illustrated in FIG. 8B is referred to as sample 2, and the electrode configuration sample illustrated in FIG. 8C is referred to as sample 3.

The inventors produced 32 copies of each of the three samples 1 through 3, and further, for comparative purposes, produced 32 copies of a comparative sample having an approximately rectangular source electrode whose lengthwise axis is perpendicular to the lengthwise axis of semiconductor substrate 32.

Figure 8D:
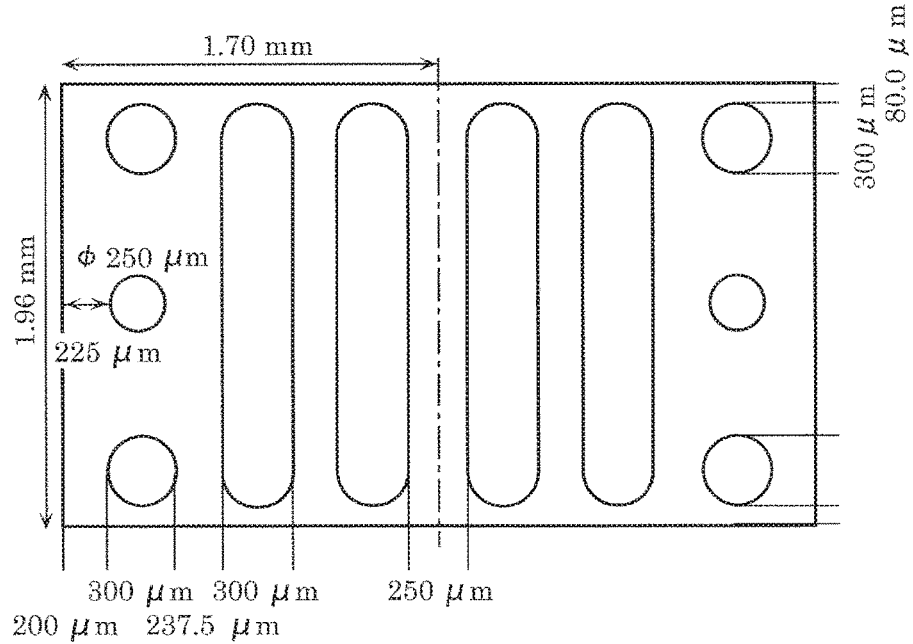
FIG. 8D is a top view of an electrode configuration of a comparative sample.

FIG. 8D is a top view of the electrode configuration of the comparative sample produced by the inventors.

The inventors reflowed each of the samples 1 through 3 and the comparative samples with mounting substrate 51 in a face-down configuration, using solder as the bonding material, and observed the state of semiconductor device 1 after reflow.

As a result, the inventors discovered preferable locations and shapes for the electrodes in semiconductor device 1. In the following description, the bonding material is exemplified as solder, but the bonding material is not limited to the exemplary solder.

Figure 9:
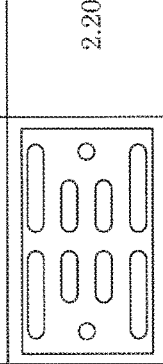
FIG. 9 illustrates results of observations made.
Figure 9:
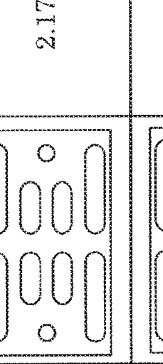
Figure 9:
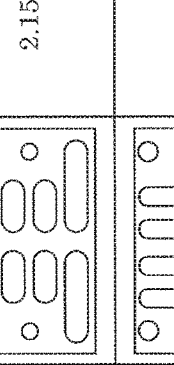
Figure 9:
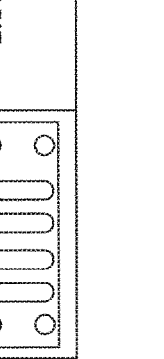

FIG. 9 illustrates the results of the observations made. In the "floating solder count" column, the number of faults resulting from solder separating from an electrode are given.

Whether the solder separated from an electrode is solder that has separated from first gate electrode 19 or second gate electrode 29 or solder that has separated from first source electrodes 11 or second source electrodes 21 is not precisely known, but in all samples, including the comparative sample, the locations and sizes of first gate electrode 19 and second gate electrode 29 satisfy the same conditions, so when comparing the number of faults, there is no objection to assuming that the solder separated from first source electrodes 11 or second source electrodes 21. Accordingly, in the "floating solder count" column, one may assume that the numbers indicate the number of faults resulting from solder separating from first source electrodes 11 and second source electrodes 21.

In the "source electrode solder protrusion count" column, the number of faults resulting from solder protruding from first source electrodes 11 or second source electrodes 21 are given.

In the "(1)+(2)" column, sum totals of the values in the corresponding "floating solder count" and "source electrode solder protrusion count" columns are given. Stated differently, in this column, the number of faults pertaining to solder relative to first source electrodes 11 or second source electrodes 21 (hereinafter referred to as "source electrode solder faults") are given.

In the "on resistance" column, on resistance values between the plurality of first source electrodes 11 and the plurality of second source electrodes 21 when semiconductor device 1 is on are given.

<Provision for Protrusion of Bonding Material from an Electrode, Floating Solder Separated from an Electrode>

Looking at FIG. 9, one can see that any one of samples 1 through 3 has a lower source electrode solder fault count than the comparative sample. That is, forming the approximately rectangular shaped source electrodes to extend parallel rather than perpendicular to the lengthwise direction of semiconductor substrate 32 more effectively prevents faults related to source electrode solder.

Hereinafter, the mechanism that allows for a reduced number of faults related to source electrode solder by forming the approximately rectangular shaped source electrodes to extend parallel to the lengthwise direction of semiconductor substrate 32 will be described with reference to the drawings.

Figure 10A:
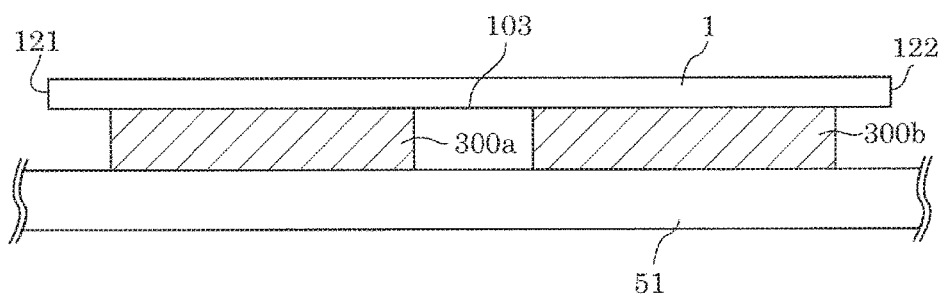
FIG. 10A schematically illustrates a cross section taken along the lengthwise direction of a semiconductor substrate, at the source electrode.
Figure 10B:
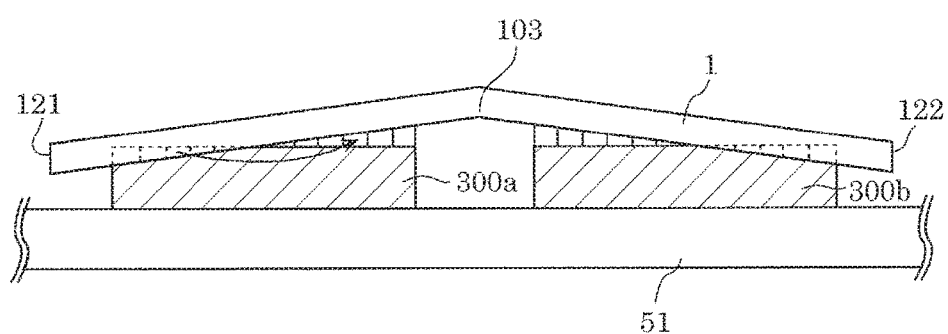
FIG. 10B schematically illustrates a cross section taken along the lengthwise direction of a semiconductor substrate, at the source electrode.

FIG. 10A and FIG. 10B schematically illustrate cross-sectional views of the lengthwise direction of semiconductor substrate 32 taken where a source electrode is, when the approximately rectangular shaped source electrodes are formed to extend parallel to the lengthwise direction of semiconductor substrate 32 (taken along line IA-IA in FIG. 2A or FIG. 2B in regard to semiconductor device 1). FIG. 10A illustrates a state in which semiconductor device 1 is not warped and FIG. 10B illustrates a state in which semiconductor device 1 exhibits positive warping.

In FIG. 10A and FIG. 10B, bonding material 300a indicates the solder for first source electrodes 11 and bonding material 300b indicates the solder for second source electrodes 21.

When semiconductor device 1 exhibits positive warping, the pressure applied to bonding material 300a is relatively greater at the first short side 121 end than at the boundary line 103 end (this is due to the gap between semiconductor device 1 and mounting substrate 51 differing in size depending on position in a plan view of semiconductor substrate 32).

As described above, since first source electrodes 11 are formed extending parallel to the lengthwise direction of semiconductor substrate 32, when the pressure applied to the semiconductor substrate 32 first short side 121 side of bonding material 300a exceeds the pressure applied to the boundary line 103 side of bonding material 300a, bonding material 300a may flow from the semiconductor substrate 32 first short side 121 end to the boundary line 103 end, as illustrated by the arrow in FIG. 10B.

Similarly, when the pressure applied to the semiconductor substrate 32 second short side 122 side of bonding material 300b exceeds the pressure applied to the boundary line 103 side of bonding material 300b, bonding material 300b may flow from the semiconductor substrate 32 second short side 122 end to the boundary line 103 end.

Accordingly, the number of faults related to source electrode solder can be reduced by forming the approximately rectangular shaped source electrodes to extend parallel to the lengthwise direction of semiconductor substrate 32.

Moreover, the mechanism resulting in a difference in pressure applied to bonding material 300a in a lengthwise direction of semiconductor substrate 32 applies not only to first source electrodes 11 but to all electrodes disposed in a plurality of discrete positions in a plan view of semiconductor substrate 32 when the gap between semiconductor device 1 and mounting substrate 51 varies, so the electrodes formed on semiconductor device 1 preferably have an approximate rectangle shape so as to have long sides parallel to the lengthwise direction of semiconductor substrate 32.

Thus, the plurality of first source electrodes 11 and the plurality of second source electrodes 21 formed on semiconductor device 1 are each preferably formed in an approximately rectangular shape so as to have long sides parallel to the lengthwise direction of semiconductor substrate 32 and collectively arranged in a striped pattern. Such a configuration makes it possible to reduce the number of faults related to source electrode solder.

For the same reason, first gate electrode 19 and second gate electrode 29 also preferably have approximate rectangle shapes whose long sides are parallel to the lengthwise direction of semiconductor substrate 32.

In other words, in a plan view of semiconductor substrate 32, the maximum span of first gate electrode 19 in the lengthwise direction of semiconductor substrate 32 is preferably greater than or equal to the maximum span of first gate electrode 19 in the transverse direction of semiconductor substrate 32.

Such a configuration makes it possible to reduce the number of faults related to source electrode solder protruding out from first gate electrode 19 or second gate electrode 29.

Also for the same reason, first gate substrate electrode 219 or second gate substrate electrode 229 that are aligned with first gate electrode 19 or second gate electrode 29, respectively, preferably has a shape such that, in a plan view of mounting substrate 51, the maximum span in the lengthwise direction of mounting substrate 51 is greater than or equal to the maximum span in the transverse direction of mounting substrate 51.

Such a configuration makes it possible to reduce the number of faults related to solder protruding from first gate substrate electrode 219 or second gate substrate electrode 229.

Furthermore, with the mechanism resulting in a difference in pressure applied to bonding material 300a in a lengthwise direction of semiconductor substrate 32, since the pressure applied to bonding material 300a is lower at the lengthwise central region than the lengthwise end regions of semiconductor device 1 exhibiting positive warping, if the electrodes are formed toward the lengthwise end regions, on one hand, bonding strength is sufficient, but on the other hand, solder is more likely to protrude from the electrodes, and if the electrodes are formed toward the lengthwise central region, on one hand, bonding strength is insufficient, but on the other hand, solder is less likely to protrude from the electrodes.

Thus, plurality of first source electrodes 11 should be disposed closer to boundary line 103 than first short side 121. It is therefore preferable that, in a plan view of semiconductor substrate 32, the nearest-neighbor distance between the plurality of first source electrodes 11 and first short side 121 (La in either FIG. 2A or FIG. 2B) is greater than the nearest-neighbor distance between the plurality of first source electrodes 11 and boundary line 103 (Le in either FIG. 2A or FIG. 2B).

Such a configuration makes it possible to reduce the number of faults related to solder protruding from first source electrodes 11.

<Provision for Open Circuit Faults Due to Insufficient Bond Between Semiconductor Device and Mounting Substrate>

According to the mechanism described above whereby bonding is sufficient if electrodes are formed toward lengthwise end regions, first gate electrode 19 should be formed proximate first short side 121 and second gate electrode 29 should be formed proximate short side 122, so in a plan view of semiconductor substrate 32, first gate electrode 19 may be arranged such that no other electrode is disposed between first gate electrode 19 and first short side 121 of semiconductor substrate 32.

Such a configuration reduces the frequency of open circuit faults caused by first gate electrode 19.

Similarly, in a plan view of semiconductor substrate 32, second gate electrode 29 may be arranged such that no other electrode is disposed between second gate electrode 29 and second short side 122 of semiconductor substrate 32.

Such a configuration reduces the frequency of open circuit faults caused by second gate electrode 29.

Hereinbefore the description has focused on a case in which semiconductor device 1 warps lengthwise along semiconductor substrate 32, but it is plausible that semiconductor device 1 may also warp in the transverse direction of semiconductor substrate 32, as illustrated in FIG. 6.

In order to prevent electrode open circuit faults from occurring in such cases, i.e., when transverse warpage occurs, at least one pair of the plurality of first source electrodes 11 (first source electrode 11a and first source electrode 11d in FIG. 2A or FIG. 2B) may be formed on either side of first gate electrode 19 in directions parallel to first short side 121 in a plan view of semiconductor substrate 32.

At the same time, in order to prevent open circuit faults from occurring due to lengthwise warpage, the electrodes may be arranged such that the nearest-neighbor distance between the above-described pair of first source electrodes 11 (first source electrode 11a and first source electrode 11d in FIG. 2A or FIG. 2B) and first short side 121 (La in FIG. 2A or FIG. 2B) is shorter than the nearest-neighbor distance between the boundary line 103 side end of first gate electrode 19 and first short side 121 (Lb in FIG. 2A or FIG. 2B).

Similarly, at least one pair of the plurality of second source electrodes 21 (second source electrode 21a and second source electrode 21d in FIG. 2A or FIG. 2B) may be formed on either side of second gate electrode 29 in directions parallel to second short side 122 in a plan view of semiconductor substrate 32.

At the same time, in order to prevent open circuit faults from occurring due to lengthwise warpage, the electrodes may be arranged such that the nearest-neighbor distance between the above-described pair of second source electrodes 21 (second source electrode 21a and second source electrode 21d in FIG. 2A or FIG. 2B) and second short side 122 (Lc in FIG. 2A or FIG. 2B) is shorter than the nearest-neighbor distance between the boundary line 103 side end of second gate electrode 29 and second short side 122 (Ld in FIG. 2A or FIG. 2B).

Such a configuration reduces the frequency of open circuit faults caused by source electrodes even when semiconductor device 1 warps both in the lengthwise and transverse directions of semiconductor substrate 32 at the same time.

Next, cases in which semiconductor device 1 warps along a line or lines connecting diagonal corners of semiconductor device 1 in a plan view (hereinafter this type of warpage will be referred to as "diagonal" warpage), as illustrated in FIG. 7, will be described.

When semiconductor device 1 warps diagonally, open source faults can be prevented if the source electrodes are formed proximate the four corners of semiconductor device 1 in a plan view of semiconductor device 1 as described above, but regarding the gate electrodes, if one gate electrode is provided for each transistor and each is formed proximate any given one of the four corners, this increases the likelihood of an open circuit fault.

In order to circumvent this, in a plan view of semiconductor substrate 32, first gate electrode 19 is preferably formed in the central region of first short side 121, and second gate electrode 29 is preferably formed in the central region of second short side 122.

Such a configuration reduces the frequency of open circuit faults caused by gate electrodes even when semiconductor device 1 warps diagonally.

In a plan view of semiconductor substrate 32, the nearest-neighbor distance between the plurality of first source electrodes 11 and first short side 121 (La in FIG. 2A or FIG. 2B) may be less than or equal to the maximum span of first gate electrode 19 in the transverse direction of semiconductor substrate 32.

Such a configuration reduces the frequency of open circuit faults caused by first source electrodes 11.

Moreover, in order to avoid short circuit faults between first gate electrode 19 and the plurality of first source electrodes 11, in a plan view of semiconductor substrate 32, the nearest-neighbor distance between the plurality of first source electrodes 11 and first gate electrode 19 (any of Lf1 through Lf4 in FIG. 2A or FIG. 2B) may be greater than or equal to the maximum span of first gate electrode 19 in the transverse direction of semiconductor substrate 32.

Since this configuration results in the size of the above-described floating solder being smaller than the transverse span of first gate electrode 19, the frequency of short circuit faults between first gate electrode 19 and the first source electrodes 11 is reduced.

Next, the maximum span of the plurality of first source electrodes 11 or the plurality of second source electrodes 21 in the transverse direction of semiconductor substrate 32 (hereinafter, this span is referred to as the "source electrode maximum span") will be considered.

Figure 11:
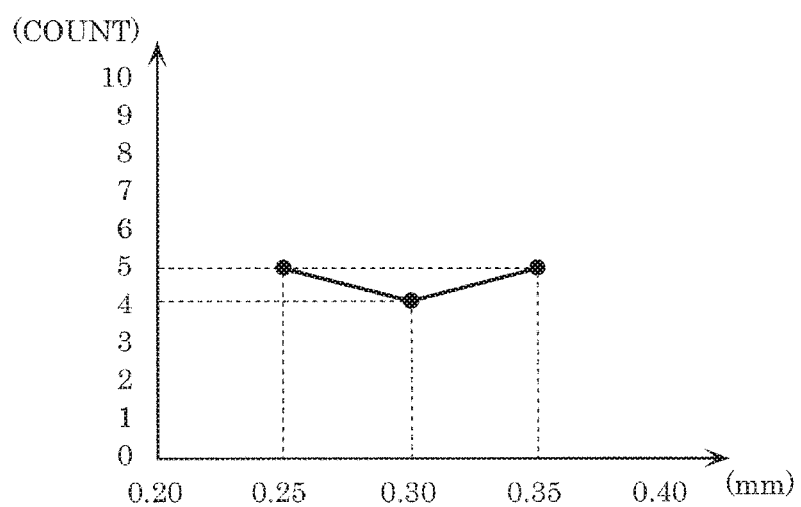
FIG. 11 is a graph illustrating the relationship between source electrode maximum span and number of source electrode solder faults.

FIG. 11 is a graph illustrating the relationship between the source electrode maximum span based on FIG. 8A through FIG. 8C and FIG. 9, and the occurrence of solder faults caused by the plurality of first source electrodes 11 or the plurality of second source electrodes 21 (hereinafter referred to as "source electrode solder faults").

In the graph illustrated in FIG. 11, source electrode maximum span is represented on the horizontal axis and source electrode solder fault count is represented on the vertical axis.

From FIG. 11, when the source electrode maximum span is in a range of from 0.25 mm to 0.35 mm, inclusive, the number of source electrode solder faults is a single digit figure, that is to say, the frequency of source electrode solder faults is comparatively low.

It can also be seen from FIG. 11 that the number of source electrode solder faults is lowest when the source electrode maximum span is 0.30 mm, and increases as the source electrode maximum span decreases to 0.25 mm and increases as the source electrode maximum span increases to 0.35 mm.

Although not illustrated in the drawings, data from a different experiment showed that as the source electrode maximum span increased from 0.20 mm to 0.30 mm, the number of source electrode solder faults monotonically increased.

Additionally, it can be seen from FIG. 9 that the on resistance of semiconductor device 1 monotonically decreases as the source electrode maximum span increases from 0.25 mm to 0.35 mm.

Based on this, regarding the magnitude of the source electrode span, one can see that there is a tradeoff between source electrode solder fault count and on resistance.

Moreover, the result that the source electrode solder fault count increases even when the source electrode span decreases is believed to be due to the fact that the nearest-neighbor distance of (i) plurality of first source electrodes 11 and the plurality of second source electrodes 21 and (ii) a long side of semiconductor substrate 32 (this nearest-neighbor distance will be described later) was simultaneously changed in the experiment.

Based on the above, at least one of (i) the plurality of first source electrodes 11 and (ii) the plurality of second source electrodes 21 has a maximum span in the transverse direction of semiconductor substrate 32 that is preferably in a range of from 0.25 mm to 0.35 mm, includes, and more preferably 0.30 mm.

Next, the nearest-neighbor distance between the plurality of first source electrodes 11 or the plurality of second source electrodes 21 and a long side of semiconductor substrate 32 (hereinafter referred to as "the nearest-neighbor distance between a source electrode and a long side of semiconductor substrate 32") will be considered.

As illustrated in FIG. 6, since semiconductor device 1 may also experience positive warping when the warping of semiconductor device 1 is in the transverse direction of semiconductor substrate 32, by increasing the nearest-neighbor distance between a source electrode and a long side of semiconductor substrate 32, it is possible to reduce the frequency of faults resulting from solder protruding from first source electrodes 11 or second source electrodes 21.

From FIG. 8A through FIG. 8C and FIG. 9, it can be seen that the number of source electrode solder faults is lowest when the nearest-neighbor distance between a source electrode and a long side of semiconductor substrate 32 is 0.080 mm, compared to when this nearest-neighbor distance is less than 0.080 mm.

Accordingly, based on this, the nearest-neighbor distance between a source electrode and a long side of semiconductor substrate 32 is preferably 0.080 mm or greater.

Next, the shapes of first gate electrode 19 and first gate substrate electrode 219 will be considered.

As described above, when semiconductor device 1 exhibits positive warping during reflow, the pressure applied to the solder is relatively greater at the first short side 121 end than at the boundary line 103 end.

Accordingly, either first gate electrode 19 or first gate substrate electrode 219 is preferably shaped so as to allow solder to flow from the first short side 121 end to the boundary line 103 end, along first gate electrode 19 or first gate substrate electrode 219, respectively.

In other words, in a plan view of semiconductor substrate 32, the maximum span of first gate electrode 19 in the lengthwise direction of semiconductor substrate 32 is preferably greater than or equal to the maximum span of first gate electrode 19 in the transverse direction of semiconductor substrate 32.

Moreover, first gate substrate electrode 219 preferably has a shape such that, in a plan view of mounting substrate 51, the maximum span in the lengthwise direction of mounting substrate 51 is greater than or equal to the maximum span in the transverse direction of mounting substrate 51.

Next, the relationship between the sizes of first gate electrode 19, first gate substrate electrode 219, and bonding material 300 at the beginning of the reflow process (see FIG. 13; to be described later) will be considered.

The surface area of first gate electrode 19 in a plan view of semiconductor substrate 32 is preferably different than the surface area of first gate substrate electrode 219 in a plan view of mounting substrate 51.

Such a configuration makes it possible to reduce the frequency of faults resulting from bonding material 300 protruding from first gate electrode 19 and bonding material 300 protruding from first gate substrate electrode 219 during reflow.

This is because if the surface area of bonding material 300 in a plan view of mounting substrate 51 at the beginning of reflow is the same as the smaller of the surface areas of first gate electrode 19 in a plan view of semiconductor substrate 32 and first gate substrate electrode 219 in a plan view of mounting substrate 51, even if semiconductor device 1 positively warps and a high amount of pressure is applied to bonding material 300 during reflow, the one of the first gate electrode 19 and the first gate substrate electrode 219 having the larger surface area has enough space at the electrode portion for bonding material 300 to flow to.

Figure 12A:
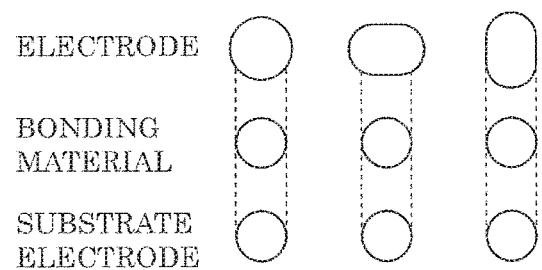
FIG. 12A schematically illustrates examples of combinations of possible shapes for a first gate electrode, a bonding material, and a first gate substrate electrode.
Figure 12B:
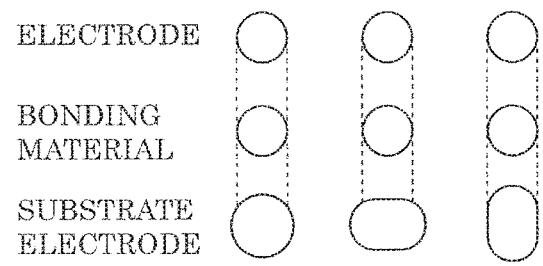
FIG. 12B schematically illustrates examples of combinations of possible shapes for a first gate electrode, a bonding material, and a first gate substrate electrode.
Figure 12C:
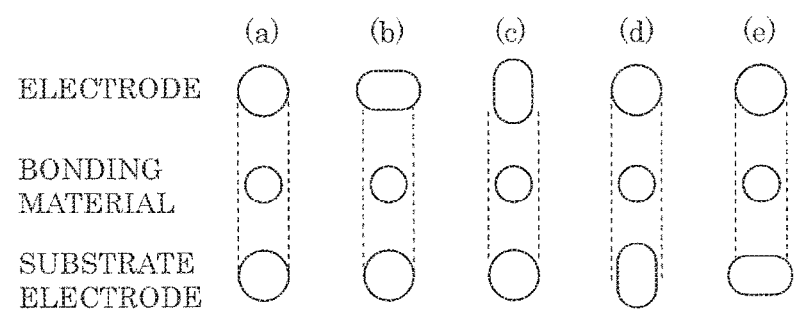
FIG. 12C schematically illustrates examples of combinations of possible shapes for a first gate electrode, a bonding material, and a first gate substrate electrode.

FIG. 12A, FIG. 12B, and FIG. 12C schematically illustrate examples of combinations of possible shapes for first gate electrode 19, bonding material 300, and first gate substrate electrode 219. In FIG. 12A, FIG. 12B, and FIG. 12C, "electrode", "bonding material", and "substrate electrode" correspond to first gate electrode 19, bonding material 300, and first gate substrate electrode 219, respectively.

FIG. 12A schematically illustrates examples of combinations of possible shapes for first gate electrode 19, bonding material 300, and first gate substrate electrode 219 when the surface area of first gate electrode 19 is greater than the surface area of first gate substrate electrode 219, and the surface areas of bonding material 300 and first gate substrate electrode 219 are the same. FIG. 12B schematically illustrates examples of combinations of possible shapes for first gate electrode 19, bonding material 300, and first gate substrate electrode 219 when the surface area of first gate substrate electrode 219 is greater than the surface area of first gate electrode 19, and the surface areas of bonding material 300 and first gate electrode 19 are the same.

When the surface area of first gate electrode 19 in a plan view of semiconductor substrate 32 and the surface area of first gate substrate electrode 219 in a plan view of mounting substrate 51 are the same, the surface area of bonding material 300 at the beginning of reflow is preferably smaller than that surface area.

Such a configuration makes it possible to reduce the frequency of faults resulting from bonding material 300 protruding from first gate electrode 19 and bonding material 300 protruding from first gate substrate electrode 219 during reflow.

This is because the surface area of bonding material 300 in a plan view of mounting substrate 51 at the beginning of reflow is smaller than the surface areas of first gate electrode 19 in a plan view of semiconductor substrate 32 and first gate substrate electrode 219 in a plan view of mounting substrate 51, and therefore even if semiconductor device 1 positively warps and a high amount of pressure is applied to bonding material 300 during reflow, first gate electrode 19 and the first gate substrate electrode 219 have enough space at the electrode portions thereof for bonding material 300 to flow to.

FIG. 12C schematically illustrates examples of combinations of possible shapes for first gate electrode 19, bonding material 300, and first gate substrate electrode 219 when the surface areas of first gate electrode 19 and first gate substrate electrode 219 are the same and the surface area of bonding material 300 is smaller than that surface area.

Figure 13:
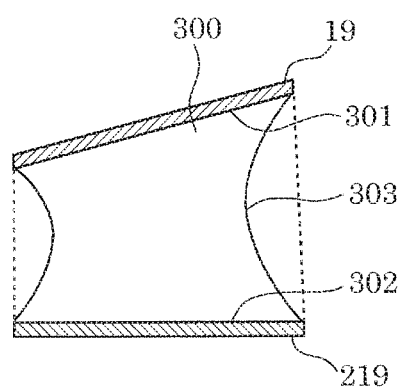
FIG. 13 schematically illustrates a cross section of bonding material taken perpendicular to a mounting substrate according to an embodiment.

FIG. 13 schematically illustrates a cross section of bonding material 300 taken perpendicular to mounting substrate 51, when there is comparatively little bonding material 300 between first gate electrode 19 and first gate substrate electrode 219, such as in the case in (a) in FIG. 12C, for example.

As illustrated in FIG. 13, bonding material 300 includes first bonding surface 301 bonded to first gate electrode 19, second bonding surface 302 bonded to first gate substrate electrode 219, and side surface 303 between first bonding surface 301 and second bonding surface 302.

When the amount of bonding material 300 between first gate electrode 19 and first gate substrate electrode 219 is comparatively small, in a cross section of bonding material 300 taken perpendicular to mounting substrate 51, side surface 303 has a straight line contour or curves inward. In such cases, it is possible to reduce the frequency that bonding material 300 protrudes from the electrodes.

Figure 14A:
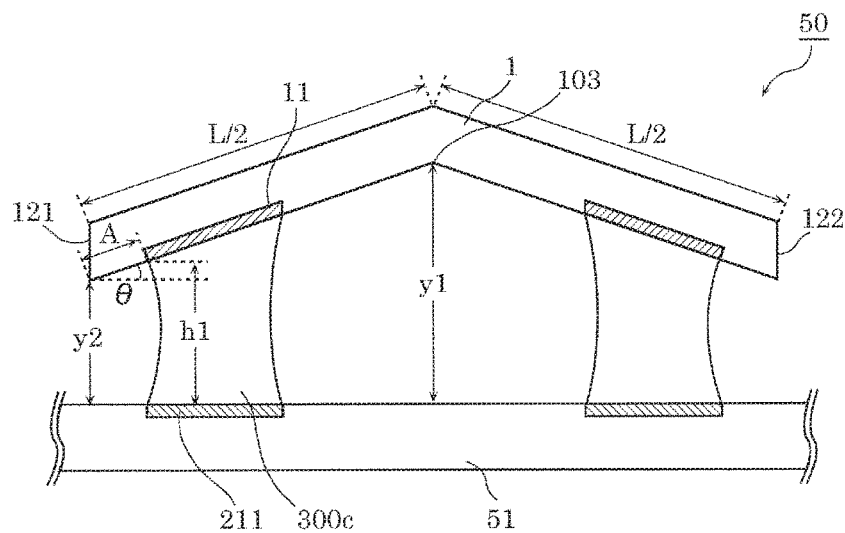
FIG. 14A schematically illustrates a cross section of a semiconductor module according to an embodiment.

Based on this, the preferable shape of bonding material 300 for producing successful results after reflow is one whereby, in a cross section of bonding material 300 taken perpendicular to mounting substrate 51, side surface 303 has a straight line contour or curves inward FIG. 14A schematically illustrates a cross section of semiconductor module 50 including semiconductor device 1 mounted face-down on mounting substrate 51. Here, semiconductor device 1 exhibits positive warping whereby the concave surface of semiconductor device 1 faces mounting substrate 51.

Bonding material 300c in FIG. 14A is a bonding material bonded to one of first gate electrode 19 and first source electrodes 11 that is disposed the closest to first short side 121 in a plan view of semiconductor substrate 32.

A is the nearest-neighbor distance between (i) first gate electrode 19 and the plurality of first source electrodes 11 and (ii) first short side 121 in a plan view of semiconductor substrate 32.

L is the length of semiconductor substrate 32 in the lengthwise direction.

y1 is a size of the gap between semiconductor device 1 and mounting substrate 51 at boundary line 103.

Here, the size of the gap between semiconductor device 1 and mounting substrate 51 at boundary line 103 is the distance from the top surface of the substrate electrodes (first gate substrate electrode 219, the plurality of first source substrate electrodes 211, second gate substrate electrode 229, the second source substrate electrodes 221) formed on the top surface of mounting substrate 51 to a point on boundary line 103 of semiconductor device 1.

y2 is a size of the gap between semiconductor device 1 and mounting substrate 51 at first short side 121.

Here, the size of the gap between semiconductor device 1 and mounting substrate 51 at first short side 121 is the distance from the top surface of the substrate electrodes formed on the top surface of mounting substrate 51 to a point on first short side 121 of semiconductor device 1.

In order to prevent semiconductor device 1 and mounting substrate 51 from coming into contact with one another, a predetermined margin value, such as 5 μm or 10 μm, needs to be maintained for y2.

h1 is the thickness of bonding material 300c at the end nearest first short side 121.

Here, the end nearest first short side 121 refers to a location nearest first short side 121 in the region in which bonding material 300c is in contact with the top surface of semiconductor device 1. Moreover, the thickness of bonding material 300c at the end nearest first short side 121 is the distance from the top surface of the substrate electrodes formed on the top surface of mounting substrate 51 to a location on semiconductor device 1 at the end of bonding material 300c nearest first short side 121.

As illustrated in FIG. 14A, when the angle between the top surface of semiconductor device 1 and the top surface of mounting substrate 51 is expressed as θ, θ can be expressed by Expression 1 shown below.

$$\theta = \arcsin(2 \times (y1 - y2)/L) \quad \text{(Expression 1)}$$

Moreover, h1−y2 is expressed by Expression 2 shown below.

$$h1 - y2 = A \times \sin\theta \quad \text{(Expression 2)}$$

Accordingly, in order to prevent semiconductor device 1 and mounting substrate 51 from coming into contact with one another, h1 preferably satisfies Expression 3 shown below.

$$h1 > A \times \sin\theta + y2 \quad \text{(Expression 3)}$$

Figure 14B:
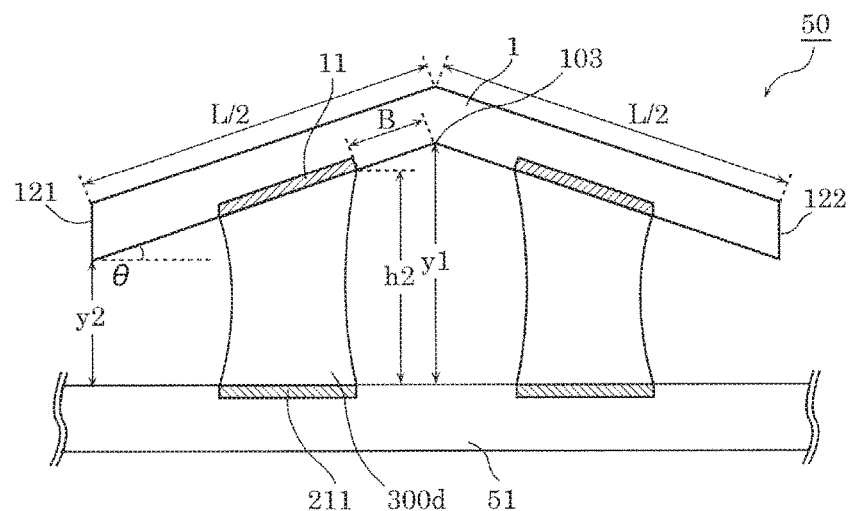
FIG. 14B schematically illustrates a cross section of a semiconductor module according to an embodiment.

FIG. 14B schematically illustrates a cross section of semiconductor module 50 including semiconductor device 1 mounted face-down on mounting substrate 51. Here, semiconductor device 1 exhibits positive warping whereby the concave surface of semiconductor device 1 faces mounting substrate 51.

Bonding material 300d in FIG. 14B is a bonding material bonded to one of first gate electrode 19 and first source electrodes 11 that is disposed the closest to boundary line 103 in a plan view of semiconductor substrate 32.

B is the nearest-neighbor distance between (i) first gate electrode 19 and the plurality of first source electrodes 11 and (i) boundary line 103 in a plan view of semiconductor substrate 32.

L, y1, y2, and θ are the same as in FIG. 14A.

h2 is the thickness of bonding material 300d at the end nearest boundary line 103.

Here, the end nearest boundary line 103 refers to a location nearest boundary line 103 in the region in which bonding material 300d is in contact with the top surface of semiconductor device 1. Moreover, the thickness of bonding material 300d at the end nearest boundary line 103 is the distance from the top surface of the substrate electrodes formed on the top surface of mounting substrate 51 to a location on semiconductor device 1 at the end of bonding material 300d nearest boundary line 103.

As illustrated in FIG. 14B, h2−y2 is expressed by Expression 4 shown below.

$$h2 - y2 = (L/2 - B) \times \sin\theta \quad \text{(Expression 4)}$$

Accordingly, in order to prevent semiconductor device 1 and mounting substrate 51 from coming into contact with one another, h2 preferably satisfies Expression 5 shown below.

$$h2 > (L/2 - B) \times \sin\theta + y2 \quad \text{(Expression 5)}$$

(4. Mounting Substrate Warpage)

Mounting substrate 51 may warp depending on changes in the ambient temperature of the location in which semiconductor module 50 is used as a product or changes in mounting substrate 51 with age. There is a need to prevent semiconductor device 1 and mounting substrate 51 from coming into contact with one another even if such warping occurs.

Figure 15A:
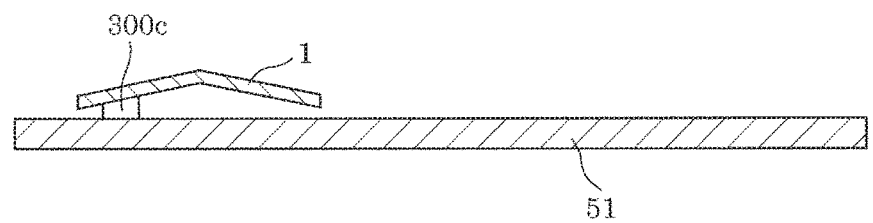
FIG. 15A schematically illustrates a cross section of a semiconductor module according to an embodiment when a semiconductor device according to an embodiment is not warped.
Figure 15B:
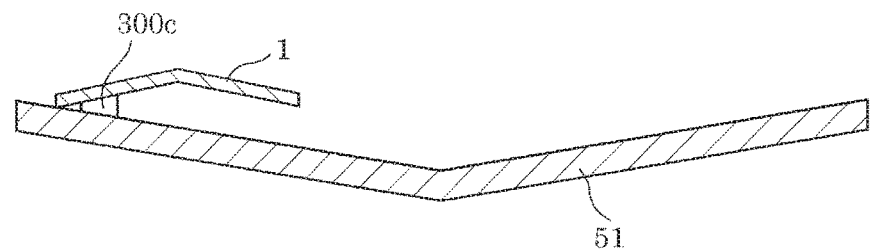
FIG. 15B schematically illustrates a cross section of a semiconductor module according to an embodiment when a semiconductor device according to an embodiment is warped.

FIG. 15A schematically illustrates a cross section of semiconductor module 50 in a state in which mounting substrate 51 is not warped. FIG. 15B schematically illustrates a cross section of semiconductor module 50 in a state in which mounting substrate 51 is warped.

Even when semiconductor device 1 and mounting substrate 51 are not in contact with one another in a state in which mounting substrate 51 is not warped (FIG. 15A), when mounting substrate 51 does warp, semiconductor device 1 and mounting substrate 51 may come into contact with one another (FIG. 15B).

Figure 16A:
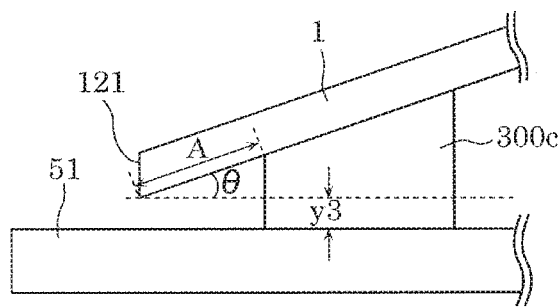
FIG. 16A schematically illustrates a cross section of a semiconductor module according to an embodiment when a semiconductor device according to an embodiment is not warped.

FIG. 16A schematically illustrates a cross section of semiconductor module 50 in the vicinity of first short side 121 in a state in which mounting substrate 51 is not warped, and is a partial enlarged view of FIG. 15A.

Figure 16B:
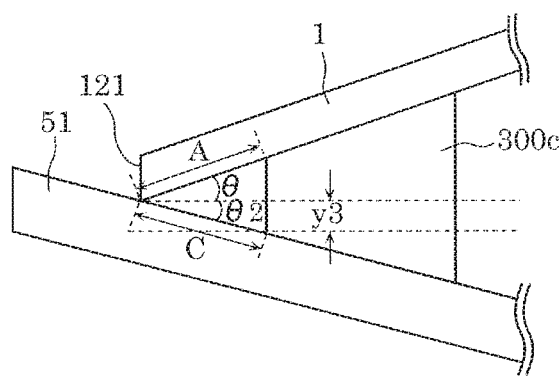
FIG. 16B schematically illustrates a cross section of a mounting substrate according to an embodiment when a semiconductor device according to an embodiment is warped.

FIG. 16B schematically illustrates a cross section of semiconductor module 50 in the vicinity of first short side 121 in a state in which mounting substrate 51 is warped and semiconductor device 1 and mounting substrate 51 are in contact, and is a partial enlarged view of FIG. 15B.

In FIG. 16A and FIG. 16B, similar to FIG. 14A, bonding material 300c is a bonding material bonded to one of first gate electrode 19 and first source electrodes 11 that is disposed the closest to first short side 121 in a plan view of semiconductor substrate 32. Moreover, A and θ are also the same as in FIG. 14A.

In FIG. 16B, θ2 is the angle between the top surface of mounting substrate 51 in a non-warped state and the top surface of mounting substrate 51 in a warped state.

C is the nearest-neighbor distance between (i) the contact point of semiconductor device 1 and mounting substrate 51 and (ii) bonding material 300c in a plan view of mounting substrate 51.

In order to prevent semiconductor device 1 and mounting substrate 51 from coming into contact with one another even when mounting substrate 51 warps, y3 needs to satisfy the conditions in Expression 6 shown below, where y3 is the nearest-neighbor distance between semiconductor device 1 and mounting substrate 51.

$$y3 > C \times \sin\theta2 \quad \text{(Expression 6)}$$

The value of sin θ2 is a typical empirical value expressing the warp amount of mounting substrate 51, and is calculated to be 0.02 by using data indicating 1 mm per 50 mm of length of mounting substrate 51.

Accordingly, in order to prevent semiconductor device 1 and mounting substrate 51 from coming into contact with one another, y3 preferably satisfies Expression 7 shown below.

$$y3 > 0.02 \times C \qquad \text{(Expression 7)}$$

Note that the nearest-neighbor distance between (i) first gate electrode 19 and first source electrodes 11 and (ii) first short side 121 in a plan view of semiconductor substrate 32 may be used for C. Even in such cases, the influence on computation is within the margin of error.

A semiconductor device according to one or more aspects of the present invention has been described based on an embodiment, but the present disclosure is not limited to this embodiment. Those skilled in the art will readily appreciate that embodiments arrived at by making various modifications to the above embodiment or embodiments arrived at by selectively combining elements disclosed in the above embodiment without materially departing from the novel teachings and advantages of the present disclosure may be included within one or more aspects of the present disclosure.

INDUSTRIAL APPLICABILITY

The semiconductor device according to the present invention can be used as a CSP semiconductor device in a variety of semiconductor devices, such as a bidirectional transistor, unidirectional transistor, or diode.

What is claimed is:

1. A semiconductor device in a face-down, chip-size package, including: a semiconductor substrate that is rectangular and includes an impurity of a first conductivity type; a low-concentration impurity layer that is in contact with a top surface of the semiconductor substrate and includes an impurity of the first conductivity type in a lower concentration than a concentration of the impurity of the first conductivity type included in the semiconductor substrate; and a metal layer that is in contact with an entire bottom surface of the semiconductor substrate and includes only a metal material, the semiconductor device having a curvature at room temperature that curves in a lengthwise direction of the semiconductor substrate, the semiconductor device comprising:

a first vertical metal oxide semiconductor (MOS) transistor in a first region of the low-concentration impurity layer; and a second vertical MOS transistor in a second region of the low-concentration impurity layer adjacent to the first region, wherein the first vertical MOS transistor includes, on a surface of the low-concentration impurity layer, a first gate electrode and a plurality of first source electrodes, the second vertical MOS transistor includes, on the surface of the low-concentration impurity layer, a second gate electrode and a plurality of second source electrodes, the semiconductor substrate acts as a common drain region for a first drain region of the first vertical MOS transistor and a second drain region of the second vertical MOS transistor, a bidirectional channel from the plurality of first source electrodes to the plurality of second source electrodes via the first drain region, the metal layer, and the second drain region is a principal current channel, in a plan view of the semiconductor substrate, the first gate electrode is arranged with no other electrode disposed between the first gate electrode and a first short side of the semiconductor substrate, the plurality of first source electrodes include a plurality of first source electrodes that are approximately rectangular in a plan view of the semiconductor substrate, in a plan view of the semiconductor substrate, the plurality of first source electrodes that are approximately rectangular are arranged in stripes extending parallel to the lengthwise direction of the semiconductor substrate, in a plan view of the semiconductor substrate, the second gate electrode is arranged with no other electrode disposed between the second gate electrode and a second short side of the semiconductor substrate, the plurality of second source electrodes include a plurality of second source electrodes that are approximately rectangular in a plan view of the semiconductor substrate, in a plan view of the semiconductor substrate, the plurality of second source electrodes that are approximately rectangular are arranged in stripes extending parallel to the lengthwise direction of the semiconductor substrate, in a plan view of the semiconductor substrate, a boundary line between the first region and the second region is an approximate line segment, and in a plan view of the semiconductor substrate, the first gate electrode and the second gate electrode are symmetrical to one another with respect to the boundary line, and the plurality of first source electrodes and the plurality of second source electrodes are symmetrical to one another with respect to the boundary line.

2. The semiconductor device according to claim 1, wherein in a plan view of the semiconductor substrate, the first gate electrode is arranged proximate a middle of the first short side, and in a plan view of the semiconductor substrate, the second gate electrode is arranged proximate a middle of the second short side.

3. The semiconductor device according to claim 2, wherein the plurality of first source electrodes include at least one pair of first source electrodes disposed on either side of the first gate electrode in directions parallel to the first short side in a plan view of the semiconductor substrate, and a nearest-neighbor distance between the at least one pair of first source electrodes and the first short side is less than or equal to a nearest-neighbor distance between the first short side and an end nearest the boundary line among ends of the first gate electrode, and the plurality of second source electrodes include at least one pair of second source electrodes disposed on either side of the second gate electrode in directions parallel to the second short side in a plan view of the semiconductor substrate, and a nearest-neighbor distance between the at least one pair of second source electrodes and the second short side is less than or equal to a nearest-neighbor distance between the second short side and an end nearest the boundary line among ends of the second gate electrode.

4. The semiconductor device according to claim 3, wherein in a plan view of the semiconductor substrate, a first nearest-neighbor distance between the plurality of first source electrodes and the first short side is less than or equal to a maximum span of the first gate electrode in a transverse direction of the semiconductor substrate.

5. The semiconductor device according to claim 4, wherein
in a plan view of the semiconductor substrate, the first nearest-neighbor distance is longer than a second nearest-neighbor distance between the plurality of first source electrodes and the boundary line.

6. The semiconductor device according to claim 5, wherein
in a plan view of the semiconductor substrate, a third nearest-neighbor distance between the plurality of first source electrodes and the first gate electrode is greater than or equal to the maximum span of the first gate electrode in the transverse direction of the semiconductor substrate.

7. The semiconductor device according to claim 1, wherein
in a plan view of the semiconductor substrate, at least one first source electrode among the plurality of first source electrodes has a maximum span in a transverse direction of the semiconductor substrate in a range of from 0.25 mm to 0.35 mm, inclusive.

8. The semiconductor device according to claim 1, wherein
in a plan view of the semiconductor substrate, a nearest-neighbor distance between the plurality of first source electrodes and a long side of the semiconductor substrate is at least 0.08 mm.

9. The semiconductor device according to claim 1, wherein
in a plan view of the semiconductor substrate, a maximum span of the first gate electrode in the lengthwise direction of the semiconductor substrate is greater than or equal to a maximum span of the first gate electrode in a transverse direction of the semiconductor substrate.

10. A semiconductor module including the semiconductor device according to claim 1 having a concave surface defined by the curvature, the semiconductor device being mounted with the concave surface face-down on a mounting substrate, wherein
the mounting substrate includes, on a top surface, a gate substrate electrode connected to the first gate electrode via a bonding material, and
in a plan view of the mounting substrate, the gate substrate electrode has a maximum span in the lengthwise direction of the semiconductor substrate that is greater than a maximum span in a transverse direction of the semiconductor substrate.

11. A semiconductor module including the semiconductor device according to claim 1 having a concave surface defined by the curvature, the semiconductor device being mounted with the concave surface face-down on a mounting substrate, wherein
the mounting substrate includes, on a top surface, a gate substrate electrode connected to the first gate electrode via a bonding material, and
a surface area of the first gate electrode in a plan view of the semiconductor substrate is different from a surface area of the gate substrate electrode in a plan view of the mounting substrate.

12. A semiconductor module including the semiconductor device according to claim 1 having a concave surface defined by the curvature, the semiconductor device being mounted with the concave surface face-down on a mounting substrate, wherein
the mounting substrate includes, on a top surface, a gate substrate electrode connected to the first gate electrode via a bonding material,
the bonding material includes:
a first bonding surface bonded with the first gate electrode;
a second bonding surface bonded with the gate substrate electrode; and
a side surface between the first bonding surface and the second bonding surface, and
in a cross section of the bonding material taken perpendicular to the mounting substrate, the side surface has a straight line contour or curves inward.

13. A semiconductor module including the semiconductor device according to claim 1 having a concave surface defined by the curvature, the semiconductor device being mounted with the concave surface face-down on a mounting substrate with a bonding material disposed in a plurality of discrete locations between the semiconductor device and the mounting substrate, wherein
the semiconductor module satisfies:

$$\theta = \arcsin(2 \times (y1-y2)/L)$$

and $$h1 > A \times \sin\theta + y2$$

where:
h1 is a thickness of an end nearest the first short side among ends of the bonding material disposed in a first discrete location nearest the first short side in a plan view of the semiconductor substrate among the plurality of discrete locations;
y1 is a size of a gap between the semiconductor device and the mounting substrate at the boundary line;
y2 is a size of a gap between the semiconductor device and the mounting substrate at the first short side;
L is a length of the semiconductor substrate in the lengthwise direction; and
A is, in a plan view of the semiconductor substrate, a nearest-neighbor distance between (i) the first gate electrode and the plurality of first source electrodes and (ii) the first short side.

14. The semiconductor module according to claim 13, wherein
the semiconductor module satisfies:

$$h2 > (L/2 - B) \times \sin\theta + y2$$

where:
h2 is a thickness of an end nearest the boundary line among ends of the bonding material disposed in a second discrete location nearest the boundary line in a plan view of the semiconductor substrate among the plurality of discrete locations; and
B is, in a plan view of the semiconductor substrate, a nearest-neighbor distance between (i) the first gate electrode and the plurality of first source electrodes and (ii) the boundary line.

15. A semiconductor module including the semiconductor device according to claim 1 having a concave surface defined by the curvature, the semiconductor device being mounted with the concave surface face-down on a mounting substrate, wherein
a nearest-neighbor distance between the semiconductor device and the mounting substrate is greater than or equal to $0.02 \times C$, where C is, in a plan view of the semiconductor substrate, a nearest-neighbor distance between (i) the first gate electrode and the plurality of first source electrodes and (ii) the first short side.

* * * * *